(12) United States Patent
Rozbicki et al.

(10) Patent No.: US 7,186,648 B1
(45) Date of Patent: Mar. 6, 2007

(54) BARRIER FIRST METHOD FOR SINGLE DAMASCENE TRENCH APPLICATIONS

(75) Inventors: Robert Rozbicki, San Francisco, CA (US); Michal Danek, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 79 days.

(21) Appl. No.: 10/804,353

(22) Filed: Mar. 18, 2004

Related U.S. Application Data

(63) Continuation-in-part of application No. 10/412,562, filed on Apr. 11, 2003, now Pat. No. 6,764,940, which is a continuation-in-part of application No. 09/965,475, filed on Sep. 26, 2001, now Pat. No. 6,607,977.

(60) Provisional application No. 60/379,874, filed on May 10, 2002, provisional application No. 60/275,803, filed on Mar. 13, 2001.

(51) Int. Cl.
*H01L 21/44* (2006.01)

(52) U.S. Cl. .................. 438/687; 257/E23.01

(58) Field of Classification Search ................ 438/627, 438/687
See application file for complete search history.

(56) References Cited

U.S. PATENT DOCUMENTS

| | | | |
|---|---|---|---|
| 5,221,449 A | 6/1993 | Colgan et al. | |
| 5,281,485 A | 1/1994 | Colgan et al. | |
| 5,482,611 A | 1/1996 | Helmer et al. | |
| 5,904,565 A * | 5/1999 | Nguyen et al. | 438/687 |
| 5,985,762 A | 11/1999 | Geffken et al. | |
| 6,074,544 A | 6/2000 | Reid et al. | |
| 6,080,285 A | 6/2000 | Liu et al. | |
| 6,099,702 A | 8/2000 | Reid et al. | |
| 6,110,346 A | 8/2000 | Reid et al. | |
| 6,124,203 A | 9/2000 | Joo et al. | |
| 6,126,798 A | 10/2000 | Reid et al. | |
| 6,139,712 A | 10/2000 | Patton et al. | |
| 6,156,167 A | 12/2000 | Patton et al. | |
| 6,159,354 A | 12/2000 | Contolini et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,217,716 B1 | 4/2001 | Fai Lai | |
| 6,221,757 B1 | 4/2001 | Schmidbauer et al. | |
| 6,228,754 B1 | 5/2001 | Iacoponi et al. | |
| 6,251,242 B1 | 6/2001 | Fu et al. | |
| 6,274,008 B1 * | 8/2001 | Gopalraja et al. | 204/192.17 |
| 6,277,249 B1 | 8/2001 | Gopalraja et al. | |
| 6,287,977 B1 | 9/2001 | Hashim et al. | |
| 6,350,353 B2 | 2/2002 | Gopalraja et al. | |

(Continued)

*Primary Examiner*—Michael Lebentritt
*Assistant Examiner*—Andre' Stevenson
(74) *Attorney, Agent, or Firm*—Beyer Weaver & Thomas LLP

(57) ABSTRACT

Methods for forming a diffusion barrier on low aspect features of an integrated circuit include at least three operations. The first operation deposits a barrier material and simultaneously etches a portion of an underlying metal at the bottoms of recessed features of the integrated circuit. The second operation deposits barrier material to provide some minimal coverage over the bottoms of the recessed features. The third operation deposits a metal conductive layer. Controlled etching is used to selectively remove barrier material from the bottom of the recessed features, either completely or partially, thus reducing the resistance of subsequently formed metal interconnects.

23 Claims, 5 Drawing Sheets

U.S. PATENT DOCUMENTS

| | | |
|---|---|---|
| 6,417,094 B1 * | 7/2002 | Zhao et al. .................. 438/627 |
| 6,492,262 B2 | 12/2002 | Uzoh |
| 6,541,374 B1 | 4/2003 | De Felipe et al. |
| 6,566,246 B1 | 5/2003 | De Felipe et al. |
| 6,607,977 B1 * | 8/2003 | Rozbicki et al. ............. 438/627 |
| 6,919,275 B2 * | 7/2005 | Chiang et al. .............. 438/687 |
| 6,949,457 B1 * | 9/2005 | Fiordalice et al. .......... 438/627 |
| 7,030,031 B2 * | 4/2006 | Wille et al. ................. 438/725 |

* cited by examiner

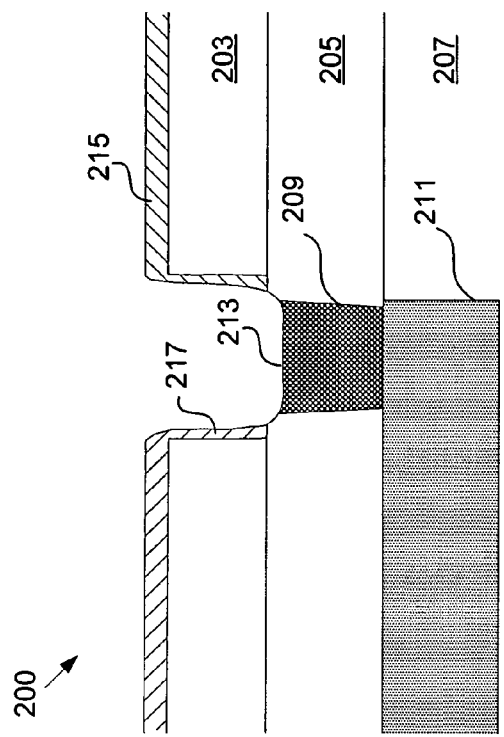
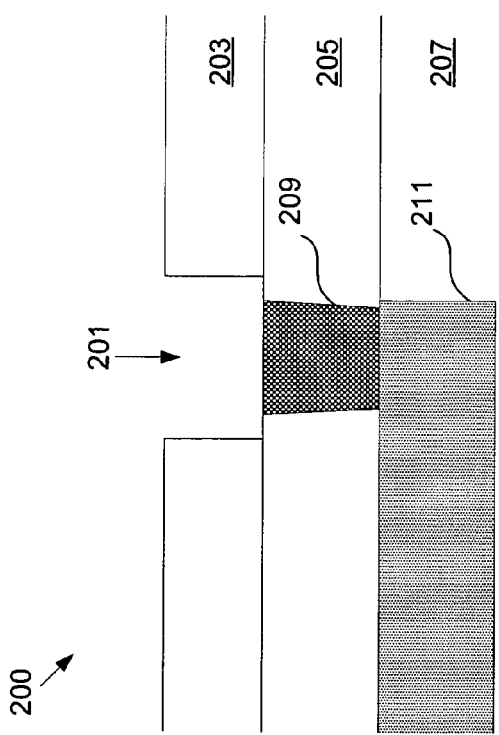
Figure 2B
Figure 2A

BARRIER FIRST METHOD FOR SINGLE DAMASCENE TRENCH APPLICATIONS

CROSS-REFERENCE TO RELATED APPLICATIONS

This application is a continuation-in-part claiming priority under 35 USC 120 from U.S. patent application Ser. No. 10/412,562 filed Apr. 11, 2003, now U.S. Pat. No. 6,764,940 titled "Method Of Depositing A Diffusion Barriers For Copper Interconnect Applications," naming Rozbicki and Danek as inventors, which is a continuation-in-part claiming priority under 35 USC 120 from Ser. No. 09/965,475, now U.S. Pat. No. 6,607,977 filed Sep. 26, 2001 (issued Aug. 19, 2003), titled "Method Of Depositing A Diffusion Barrier For Copper Interconnect Applications," naming Rozbicki et al. as inventors, which claims priority from prior U.S. Provisional Application No. 60/275,803 filed Mar. 13, 2001. U.S. patent application Ser. No. 10/412,562 also claims priority from U.S. Provisional Patent Application No. 60/379,874 filed May 10, 2002 titled "Method Of Depositing A Diffusion Barrier For Copper Interconnect Applications" naming Rozbicki and Danek as inventors. Each of these references is incorporated herein by reference in its entirety for all purposes. This patent application is also related to U.S. Pat. No. 6,566,246 issued May 20, 2003 titled "Deposition of Conformal Copper Seed Layers by Control of Barrier Layer Morphology" naming de Felipe et al. as inventors, and U.S. Pat. No. 6,541,374 issued Apr. 1, 2003 titled "Method of Depositing a Diffusion Barrier for Copper Interconnection Applications" naming de Felipe et al. as inventors. These patent documents, along with all other documents, patents and publications mentioned herein are incorporated by reference in their entireties for all purposes.

FIELD OF THE INVENTION

The present invention pertains to multi-stage methods for forming a metal diffusion barrier on a partially fabricated integrated circuit. The methods employ an early stage operation that selectively etches barrier material from the bottom of trenches while simultaneously depositing barrier material on most regions of the integrated circuit. The methods are particularly beneficial in single Damascene processes.

BACKGROUND OF THE INVENTION

In the fairly recent past, integrated circuit (IC) manufacturers have used aluminum and aluminum alloys, among other metals, as the conductive metal for integrated circuits. While copper has a greater conductivity than aluminum, it presents certain challenges, including rapid diffusion into silicon oxide where it degrades the insulating electrical properties even at very low concentrations. This and other issues have been addressed by "Damascene" processing.

In a Damascene process an interconnect pattern is first lithographically defined in a layer of dielectric and etched to form trenches and vias. Next the vias and trenches are coated with a diffusion barrier material, typically a nitride of a refractive metal such as tantalum and/or a nitride thereof such as tantalum nitride or titanium nitride. The diffusion barrier blocks diffusion of copper atoms into the dielectric layers. Copper is then deposited to fill the trenches and vias to form interconnect lines and the excess metal is removed by, for example, chemical mechanical polishing (CMP). Damascene processes can be categorized into two types: single Damascene and dual Damascene processes. A single Damascene process produces a metallization layer from two separate dielectric layers, the first being patterned to define interconnect holes or vias of the layer and the second being patterned to define interconnect horizontal line paths. In each stage, the layer in process is first patterned and then etched to define the vias or horizontal trenches. These are then coated with a diffusion barrier material and filled with copper. In a dual Damascene process, both the vias and trenches are patterned in dielectric prior to depositing the barrier material and filling with copper. It is worth noting that frequently a combination of single and dual Damascene processing is used to create an interconnect structure. For example, the first metallization layer is made by a single Damascene process, while the higher metallization layers (e.g., M2–M8) are made by dual Damascene processes.

One of the difficulties in successfully integrating either type of Damascene process involves coverage of diffusion barrier material. A variety of physical vapor deposition (PVD) techniques, such as ionized PVD, are conventionally used for depositing diffusion barrier material since these techniques provide high quality films. These PVD techniques, however, result in thick film bottom coverage in vias and trenches. Because the barrier material has a higher resistivity than copper, its thickness should be minimized at the bottoms of the vias and trenches. It is important, however, to have enough diffusion barrier material coverage at the sidewalls of the vias and trenches to sufficiently prevent copper diffusion into surrounding dielectric.

For dual Damascene processing in particular, methods for selectively etching a portion of the diffusion barrier at the via bottoms in order to expose the lower copper line have been employed. One such approach is generally described in U.S. Pat. No. 6,287,977 to Hashim et al. and U.S. Pat. No. 5,985,762 to Geffken et al. By completely etching away the barrier in the via bottom, the subsequent copper inlay can be deposited directly onto the lower copper line. These methods, however, are problematic in that they are not selective enough. That is, they remove barrier material from undesired areas as well, such as the corners (edges) of the via, trench, and field regions. This can destroy critical dimensions of the via and trench surfaces (faceting of the corners) and unnecessarily exposes the dielectric to plasma. This may lead to dielectric damage, such as critical dimension loss, increase in dielectric constant (with concomitant negative impact on device speed), and poor adhesion to the barrier layer. These problems will be encountered with the method described in the Geffken et al. patent.

To address these problems, methods that provide selective etching of via bottoms are described in U.S. Pat. No. 6,607,977 issued Aug. 19, 2003, incorporated by reference above. These methods involve etching a portion of the diffusion barrier material at the bottoms of vias without fully etching through the barrier material such that an amount of barrier material remains at the bottom of the plurality of vias, while depositing diffusion barrier material elsewhere on the wafer, particularly on the sidewalls of the vias. U.S. Patent Application No. 60/379,874 filed May 10, 2002, also incorporated within above, describes methods to address these problems in an alternative way. These methods completely etch through the diffusion barrier material at the bottoms of vias to expose a part of the underlying metal while depositing diffusion barrier material particularly on the sidewalls of the vias. Subsequently, the process deposits another layer of diffusion barrier material to cover the bottoms of the vias. These methods are especially useful in cases where unlanded vias exist in the wafer.

While the aforementioned methods minimize the amount of diffusion barrier material on via bottoms while maintaining adequate barrier material on via sidewalls, they can be handicapped by requiring a relatively long time to etch relatively thick sections of barrier sometimes found on the via bottoms. Thick barrier sections are commonly found in features having low aspect ratios (ratio of height to width) such as the trenches employed in single Damascene processes. Generally, in Damascene processes, trenches have quite low aspect ratios in comparison to vias. For example, trench aspect ratios are frequently less than about 2:1, while via aspect ratios can be as high as 3:1 in current technology. Barrier material deposits more thickly on the bottoms of low aspect ratio features than on the bottoms of high aspect ratio features. Further, due to only the one-dimensional confinement in trenches, the deposition rate (coverage) at the trench bottoms is high, often comparable to that in the field. Often the barrier thickness at the bottom of a low aspect ratio feature (such as a trench encountered in a single Damascene process) will be >80% of the thickness found in the field region of the structure.

Unfortunately, processes that selectively etch barrier from the bottom of a feature while retaining barrier on the field regions generally etch material at the bottom rather slowly. Thus, the step of removing barrier at the trench bottoms can require a long time. This can severely impact wafer throughput and may have consequences on the tool performance.

What are therefore needed are improved methods of forming effective diffusion barriers on integrated circuits structures having low aspect ratio features, such as trench features commonly found in structures produced by single Damascene processing.

SUMMARY OF THE INVENTION

The present invention pertains to high throughput methods for forming metal diffusion barriers on partially fabricated integrated circuits, particularly those having low aspect ratio features. The methods produce a continuous, relatively thin barrier coverage at trench bottoms for good reliability and low via and line resistance. The barrier coverage elsewhere (on the sidewalls and field regions) is sufficiently thick to easily meet the performance expectations of diffusion barriers. A key to high throughput is ensuring that little if any barrier is deposited on the feature bottoms early in the process. Hence, it becomes unnecessary to etch through relatively thick barrier sections at later stages in the process. Because etch time is reduced, throughput is increased.

Note that the methods of this invention, like related methods described above, selectively etch the bottoms of recessed features, and not necessarily field regions and elsewhere. Thus, this invention minimizes corner "blowout" and faceting of the recessed features without changing feature critical dimensions. Further, the invention minimizes copper contamination during wafer manufacturing processes and preserves properties of inter-level dielectrics by eliminating or minimizing direct plasma exposure. Thus, methods of this invention lower manufacturing costs by increasing yield.

As mentioned, the present invention pertains to methods for forming a diffusion barrier. When integrated with a seed layer deposition operation, the method typically includes at least three operations. The first operation selectively etches the bottoms of recessed features to clean at least part of an underlying metal. Simultaneously the first operation selectively deposits a first portion of barrier material on the trench sidewalls. The second operation deposits a second portion of barrier material to cover at least the bottoms of the recessed features while also depositing the material on other regions of the wafer. The second operation may be accomplished via any suitable process such as physical vapor deposition (PVD), chemical vapor deposition (CVD), atomic layer deposition (ALD) or pulsed deposition layer techniques (PDL). The third operation deposits a metal conductive layer over the substrate to form a conductive substrate for bulk metal deposition. In preferred embodiments, the third operation involves depositing a thin copper seed layer over the surface of the wafer. This provides a conductive surface for subsequent bulk copper deposition by electroplating.

In preferred embodiments of the invention, a degas operation is performed prior to the first operation. The purpose of the degas operation is to remove unwanted moisture and hydrocarbon etch residue that may exist on the wafer. In preferred embodiments, the wafer substrate is degassed by heating the wafer to between about 150 to 400 degrees Celsius.

The result of the operations is a metal diffusion barrier formed in part by net etching in certain areas, in particular the bottom of recessed features, and a net deposition in other areas, in particular the sidewalls of recessed features. Controlled etching is used to selectively etch barrier material from the bottom of recessed features, either completely or partially, thus reducing the resistance of subsequently formed metal interconnects. In a preferred embodiment of the invention, selective etching is also used to remove contaminants under the barrier material, thus obviating a separate preclean operation before the first operation. Of course, the invention is not limited to methods that do not employ preclean. Thus, in alternative embodiments, a preclean operation is performed prior to the initial barrier deposition operation.

In some embodiments, additional operations may be employed after depositing the second portion of the barrier layer but before depositing the metal conductive layer. For example, the process may include another etch operation to etch the bottoms of the recessed features to reduce the barrier thickness there and further improve conductance in the line paths.

Further, the invention may include one or more additional barrier deposition operations prior to forming the first portion of the diffusion barrier layer as described above. However, any such additional depositions should produce only a very thin layer of barrier on the feature bottoms to ensure that rapid etch through can be performed subsequently. In a specific example, the thickness of an initial barrier layer is between about 5 and 100 Angstroms on the sidewalls of the recessed features. This will result in only a relatively small thickness of diffusion barrier on the feature bottoms.

As mentioned, the invention is particularly useful for processes that involve low aspect ratio features, including features having aspect ratios below about 2. In some embodiments, the invention is used to form barrier layers over trenches in a single Damascene process.

In preferred embodiments of the invention, the first two operations (etching and barrier deposition) are done in a single process chamber without breaking vacuum. In other embodiments, the first two operations are performed in separate processing chambers but preferably without breaking vacuum (e.g., PVD RF resputter clean and ALD TaN barrier deposition). In preferred embodiments, the barrier and/or seed layer processing chambers are PVD chambers. In more preferred embodiments, one or both of these process chambers comprises a hollow cathode magnetron.

During methods of the invention, the first operation involves etching/deposition in a manner that cleans at least part of an underlying metal. In preferred embodiments, this first operation etches the bottoms of the recessed features to a depth of between about 20 and 100 Angstroms below the top of the underlying metal. During this operation, in preferred embodiments, the etch-to-deposition ratio (E/D) in field regions of the wafer substrate ranges between about 1 and 1.5 and E/D at the bottoms of the recessed features ranges between about 1.1 and 3.

In preferred embodiments, the first operation involves sputtering a metal from a target having an applied DC power of between about 1 and 10 kW, while biasing the wafer substrate (e.g., 200 to 2000 W RF). In some examples, the first operation comprises passing argon gas through the process chamber at a flow rate of between about 10 and 300 sccm.

During the second operation of the invention, a second portion of barrier material is preferably deposited to at least about 5 Angstroms on the bottoms of the recessed features. Also in preferred embodiments, the second portion of barrier material is deposited using CVD, PVD, ALD or PDL. In the case of PVD, a DC power of about 1–36 kW may be applied, for example. The barrier layer thickness on the field regions at this stage is, for example, between about 25 and 300 Angstroms (preferably between about 50 and 200 Angstroms). A target thickness of the barrier layer on the sidewalls of the recessed features is between about 5 and 100 Angstroms (more preferably between about 10 and 50 Angstroms).

The barrier material can be comprised of any number of materials suitable for preventing copper diffusion. In preferred embodiments, the barrier material includes a refractory metal. Examples of suitable barrier layer materials include tantalum, nitrogen-doped tantalum, tantalum nitride, titanium nitride, tungsten nitride, ruthenium and silicon containing versions of any of these.

These and other features and advantages of the present invention will be described in more detail below with reference to the associated drawings.

BRIEF DESCRIPTION OF THE DRAWINGS

FIGS. 2A–2D are cross sectional depictions of a trench in a partially fabricated integrated circuit at various stages of a single Damascene process in accordance with an embodiment of the invention.

DETAILED DESCRIPTION OF PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the term "wafer" is used interchangeably with "partially fabricated integrated circuit." One skilled in the art would understand that the term "partially fabricated integrated circuit" can refer to a silicon wafer during any of many stages of integrated circuit fabrication thereon. Thus, "wafer", "wafer substrate", and "substrate" are all used interchangeably.

The present invention provides methods for forming a diffusion barrier layer or film on a wafer surface, the purpose of which is to prevent copper or other metal diffusion into dielectric portions of the wafer. The terms "diffusion barrier layer", "diffusion barrier film", "diffusion barrier", "barrier layer", "barrier film" and "diffusion barrier material" are used interchangeably to refer to either the material itself or the layer that the material forms once on the wafer.

During methods of the invention, barrier film will be deposited over "recessed features" or "recesses" on a wafer surface. This term is used broadly to include any type of recessed features that may occur any point in wafer processing, regardless of interconnect structure type. For example, the methods may be employed on recessed features such as vias or trenches in single or dual Damascene devices. As previously mentioned, methods of the invention are particularly useful for recessed features that have low aspect ratios, such as trenches encountered in single Damascene process flows, for example. As an example, such low aspect ratio features may have aspect ratios that are not greater than about 4, and typically not greater than about 2.

Figure 1A:
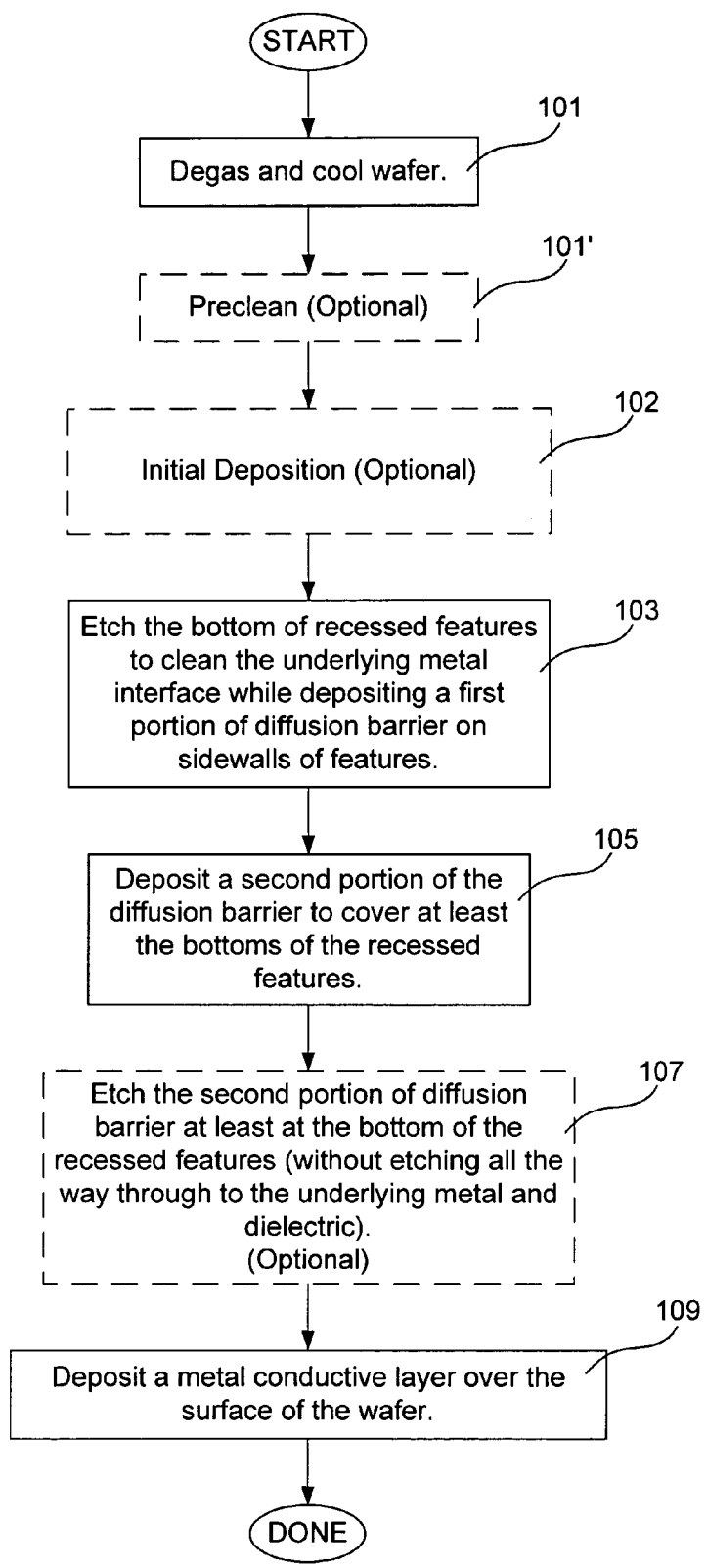
FIG. 1A presents aspects of methods for forming a diffusion barrier on a partially fabricated integrated circuit in accordance with the invention.

FIG. 1A presents aspects of a process flow for forming diffusion barriers on partially fabricated integrated circuits in accordance with the present invention. As mentioned, the invention finds particular use in forming diffusion barriers on low aspect ratio features, such as trenches in single Damascene processing. It is noted again, however, that the invention is not limited to single Damascene applications. FIGS. 2A–2D are schematic diagrams depicting a trench in a device at various stages of diffusion barrier layer formation in accordance with a single Damascene process of the invention. These figures will be referred to in conjunction with the description of the process flow of FIG. 1A for exemplary purposes. Note that in many embodiments, each of the depicted process operations is carried out using process conditions and materials specific to a particular desired outcome. The invention is not limited to these specific embodiments, but rather they are intended to illustrate the invention.

Referring to FIG. 1A, according to process block 101, first the wafer is heated under vacuum to degas the wafer surface of contaminants such as water and volatile hydrocarbons from the etch residue of the previous process. The wafer is then transferred to another chamber where it is cooled in such a manner as to not allow condensation and recontamination. Suitable chamber temperatures for the degassing process range from about 150 to 400 degrees Celsius, more preferably around 300 degrees Celsius. The cooling process is typically done at room temperature or below.

Figure 2D:
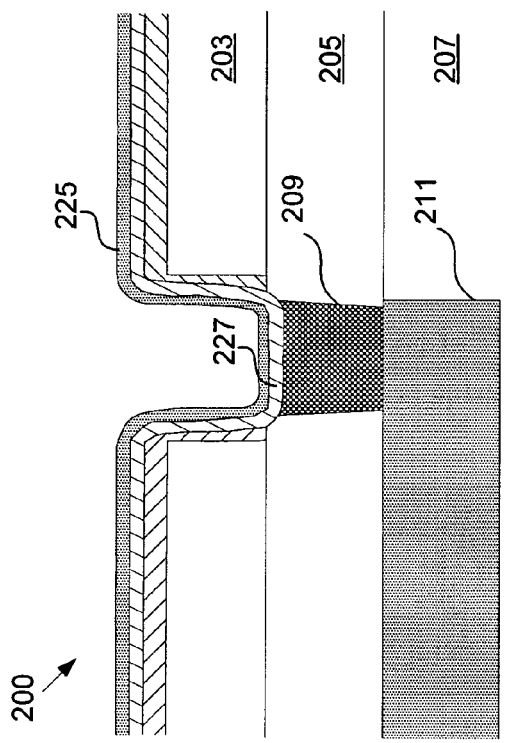

An example of a trench as produced during a single Damascene process, after a degas/cool operation, is shown in FIG. 2A. FIGS. 2A–2D are provided only for purposes of illustrating the invention and are not intended to fully represent any particular single Damascene device. Device 200 has trench 201 that was previously formed in dielectric layer 203. As shown, device 200 has a stack of three dielectric layers, 203, 205 and 207, with underlying copper line 211 and intermediary copper plug 209. Note that in many devices produced via Damascene processing, additional barrier layers (not shown) such as etch stop layers, capping layers, etc. may be interposed between dielectric layers 203 and 205, as well as between layers 205 and 207. In this case, trench 201 is shown to have a very low aspect ratio, i.e., less than 1, to better illustrate aspects of the invention and is not meant to represent an actual or even realistic device.

Preferably, the methods of this invention are performed without using a preclean step. Experimental evidence has shown that the process operations depicted in FIG. 1A are sufficient to provide a diffusion barrier substantially free of the deleterious contaminants that precleaning is intended to remove. Nevertheless, some alternative embodiments of the invention allow for a preclean operation 101' in addition to the degassing process step 101 of FIG. 1A. This preclean step typically involves implementing a sputter etch (typically argon sputter) or reactive clean process using gas mixtures, e.g., argon and hydrogen or nitrogen and hydrogen, or oxygen containing mixtures. If this preclean process is used, it is preferable that the degassing and preclean processes be done in separate chambers to avoid contamination after the preclean step. In preferred embodiments, the simultaneous etch/deposition (as described below) is used to remove surface contaminants from the trench bottom by etching through any barrier material thereon. In this way, the barrier is removed only at the trench bottom and the exposed copper is effectively cleaned by exposure to the plasma, thereby eliminating the need for a preclean step. Contaminants include residues left from etch and photoresist clean processes and oxides of copper in some instances.

The elimination of a preclean step provides various advantages. For example, during the preclean step, copper can sputter onto the walls of the trenches, which, after subsequent process steps, can lead to copper that is trapped between the dielectric material and the diffusion barrier material on the trench walls. In addition, sputter precleaning can widen trench openings thereby preventing critical dimensions from being realized. Precleaning can also increase the dielectric constant of low-k dielectrics by extracting carbon from the dielectric matrix (due to reaction with hydrogen). And, typically, precleaning requires a separate process chamber, thereby increasing the process complexity and cost.

Referring back to FIG. 1A, the next process block 102 presents an optional initial deposition of barrier material to provide some coverage of, for example, trenches in a single Damascene process. This involves depositing with an E/D ratio of less than 1 in the field regions and an E/D ratio of less than or equal to 1 at the bottom of the recessed features. This additional deposition procedure may be performed after the optional pre-clean 101' (or degas 101 if the pre-clean is not performed) but before a subsequent etch/deposition process. The pre-deposition process may be desirable in some cases to protect the sidewalls of the recesses from metal (or other material) that may be sputtered onto sidewalls in subsequent processes. However, the process should be controlled to deposit only a very limited thickness of barrier material on the feature bottoms.

Figure 1B:
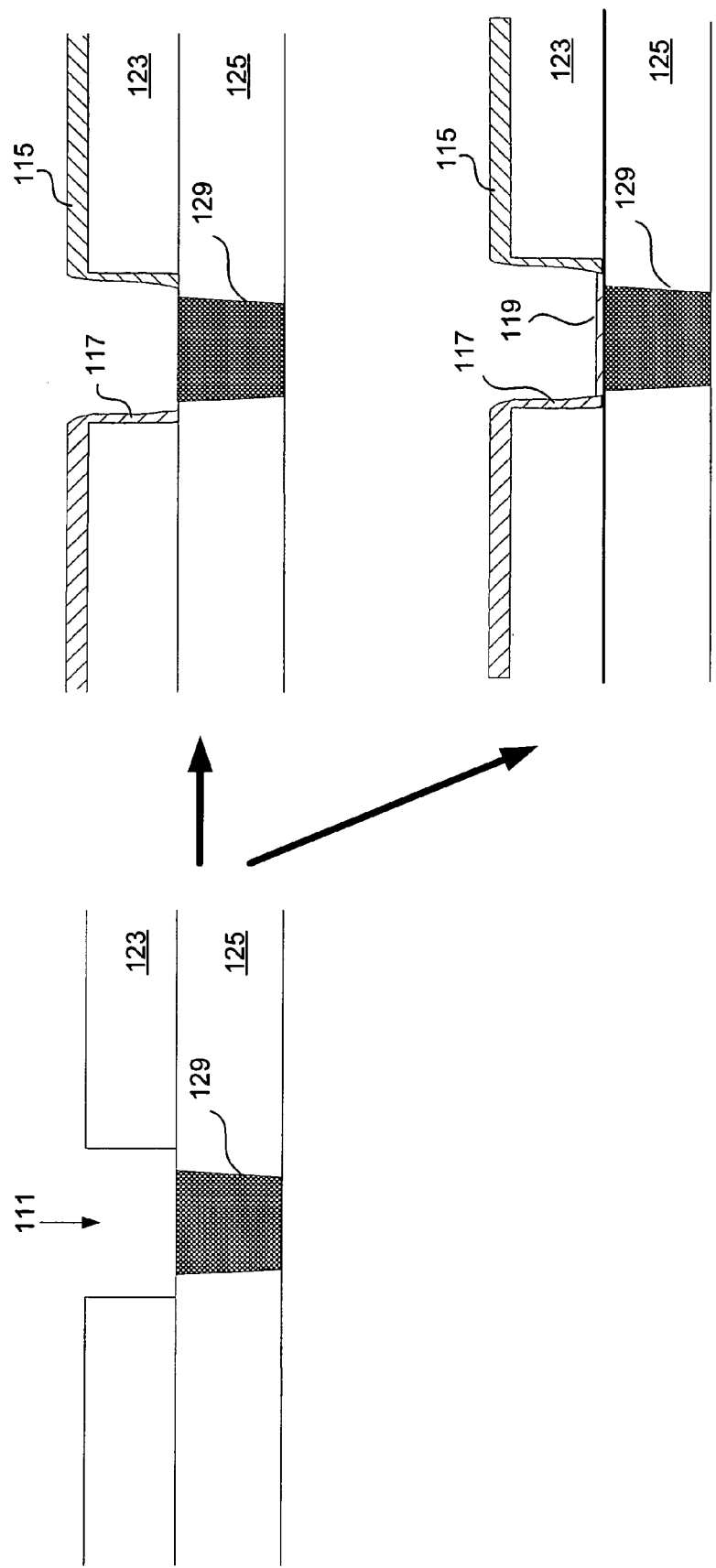
FIG. 1B is cross sectional depiction of a recessed feature (e.g., a trench) after an optional initial deposition operation.

At the end of this optional operation 102, as shown in FIG. 1B, there will some barrier 115 on the field regions adjacent to a trench 111, and depending on the E/D ratio at the trench bottom, there may or may not be additional barrier 119 deposited there as well. See the top and bottom cross sections shown in FIG. 1B. In either case, the sidewalls will include some barrier 117. In the example of FIG. 1B, the barrier is deposited on a single Damascene structure including a via level dielectric layer 125, a trench level dielectric layer 123, and a tungsten or copper plug 129.

In a particular example, the barrier layer is thinly deposited to a thickness ranging between about 5 and 100 Angstroms on the sidewalls, preferably about 10 and 50 Angstroms, and between about 5 and 100 Angstroms on the trench bottoms. Deposition of the diffusion barrier may be done using any of physical vapor deposition (PVD), chemical vapor deposition (CVD), atomic layer deposition (ALD) or pulsed deposition layer (PDL) techniques.

After degas and possibly one or both of operations 101' and 102, an etch 103 is performed. This involves simultaneously etching the bottoms of the recessed features while simultaneously depositing a first portion of diffusion barrier on feature sidewalls. Note that if operation 102 was performed, some barrier would have been already deposited on at least the sidewalls and field regions. In operation 103, the bottoms of the recesses are preferably etched to an amount sufficient to clean the surface of the underlying metal to provide a better interface with subsequently deposited barrier material. It is generally desirable to minimize the thickness of the material to reduce CMP costs in later wafer production processes. Preferably the first portion of diffusion barrier is a sputtered metal, but the invention is not limited to this, as nitrides and other suitable materials may be used. In a specific example, the sputtered metal is tantalum.

A standard method of quantifying the amount of etching and depositing is by calculating the etch-to-deposition ratio (E/D). For the processes of block 103, the E/D at the bottoms of the recesses features is significantly greater than 1 while the E/D at the field regions is only slightly greater than 1 (or even equal to 1). Preferable E/D at the bottoms of the recesses ranges between about 1.1 and 3 while preferable E/D at the field regions ranges between about 1 and 1.5. The net etch amount at the bottoms of the recesses features (the measure of material removed) can be approximated as $t(E-D*BC)$, where D is the deposition rate in the field, BC is the step coverage at the trench bottom, t is the total etch time, and E is the etch rate in the field. Note that BC represents a percentage (ranging from 0 to 1 in the expression) of the step coverage during resputtering.

The etch/deposition process 103 is preferably carried out using RF re-sputtering techniques. For example, one method using this technique includes sputtering a metal from target having an applied DC power of between about 1 and 10 kW while applying a RF bias to the wafer substrate. Suitable wafer substrate biases range between about 100 and 2000 W, preferably 200–1200 W. Note that the choice of DC and RF power depends on the substrate size, thus the wide range in power. A preferable carrier gas for the RF re-sputtering technique is argon, however, other gases such as $N_2$, Ne and Xe can also be used. Suitable gas flow rate range between about 10 and 300 sccm.

FIG. 2B depicts single Damascene structure 200 (a structure produced during single Damascene processing) after such an etch/deposition process. A copper plug 209 is etched at a trench bottom 213, exposing a new surface of the copper. Preferably, the copper will be etched between 20 and 100 Angstroms. At the end of this process, the barrier material is deposited on a side wall surface 217 to a thickness of, for example, between about 5 and 100 Angstroms (more preferably between about 10 and 50 Angstroms). Note that FIG. 2B shows barrier 215 on the field regions. Because operation 103 is typically performed at a field E/D ratio of slightly greater than 1, this implies that operation 102 was performed. If operation 102 was not performed, then typically there would be little if any barrier located on the field regions at this stage.

Returning to FIG. 1A, the next block 105 depicts depositing a second portion of the diffusion barrier over the surface of the wafer. Deposition of the second portion of the diffusion barrier may be done using PVD, CVD, ALD and/or PDL, for example. In many embodiments, the second portion of the diffusion barrier includes at least one of tantalum, nitrogen-doped tantalum, tantalum nitride, titanium nitride, ruthenium and titanium silicon nitride. Tantalum, nitrogen-doped tantalum, and tantalum nitride may be deposited using PVD. Other materials for which the invention is applicable include but are not limited to tungsten, cobalt, and other refractory nitrides (e.g. TiN, $WN_x$). These materials would also preferably be deposited by PVD. Suitable DC power for the PVD sputter target range between about 1 and 50 kW when not significantly biasing the wafer, with a preferred DC power range between about 15 and 36 kW. In some embodiments, this process is performed without applying a bias to the substrate. Titanium silicon nitride is preferably deposited using CVD or ALD. If deposited by PVD, suitable thicknesses for the second portion of barrier material range between about 10 and 400 angstroms, preferably between about 50 and 200 angstroms, as measured over field regions on the surface of the wafer. If deposited by CVD or ALD, the thicknesses of the barrier material range between about 10 and 100 angstroms, preferably between about 10 and 50 angstroms, as measured over the field regions on the surface of the wafer. The diffusion barrier is preferably deposited to at least about 5 Angstroms on the bottoms of the recessed features.

Figure 2C:
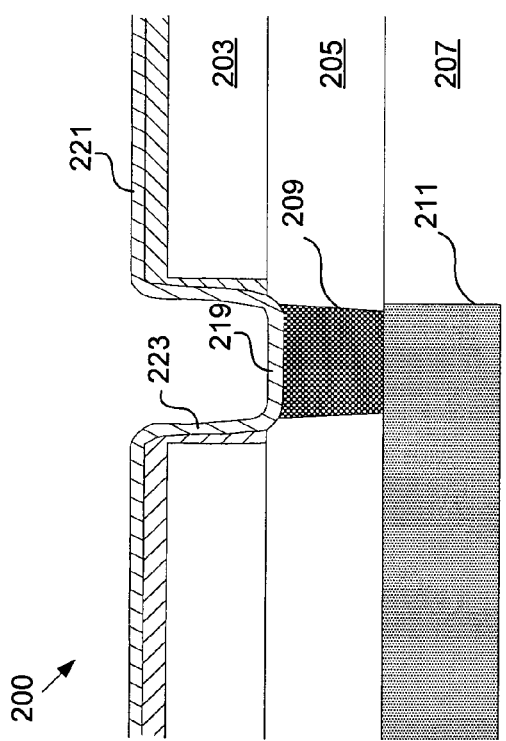

FIG. 2C depicts single Damascene structure 200 after deposition of the second portion of the diffusion barrier. The second portion can cover all surfaces of structure 200, including the trench bottom 219, sidewall 223 and field region 221. The second portion can be a monolayer, i.e., a single layer of material. Note that the term "monolayer" is not necessarily a single atomic or molecular layer as the term is sometimes used. In some embodiments, a bilayer or a trilayer is preferred. The invention is not limited to deposition of a particular number of layers. Essentially any thickness of diffusion barrier material may be deposited: fractional layers, monolayers, bilayers, trilayers, etc. Note that PVD methods in general will often provide less conformal barrier layer coverage compared to CVD and ALD methods. FIG. 2C depicts a more conformal barrier layer deposition, more representative of a CVD or ALD methods. Since preferred methods typically employ PVD, the resulting barrier layers in these cases may be less conformal than depicted in FIG. 2C.

Referring again to FIG. 1A, the next block 107 in the process flow is an optional process involving the etching of the second portion of the diffusion barrier without etching all the way through to the underlying metal. If, for instance, the second portion of the barrier layer was deposited too thickly, this process removes some of the barrier layer at the bottom of the recessed feature. This process may be similar to the process of block 103 in that it can be performed in a manner that simultaneously deposits barrier material elsewhere on the wafer. However, since the sidewalls of the recesses are already sufficiently covered by the first and second portions of barrier layer, sidewall coverage may be less significant. Of course, any number of subsequent barrier material deposition and/or etch steps may be added until a desired final barrier step coverage is achieved. The etch/deposition process is preferably carried out using RF re-sputtering techniques similar to those described in reference to process block 103. This optional etch process 107 is not depicted in the series of FIGS. 2A–2D.

Once the diffusion barrier is formed and an appropriate amount of barrier material exists on the bottoms of the recessed features and side walls, the next operation of FIG. 1A (block 109) involves depositing a metal conductive layer over the surface of the wafer such that the metal conductive layer is separated from the underlying metal layer by the small amount of barrier material at the bottom of the recessed feature. FIG. 2D depicts substrate 200 after deposition of metal conductive layers 225. In this example, the metal conductive layers are copper seed layers, but the invention is not limited to seed layers.

As illustrated in FIG. 2D, newly deposited metal conductive layer 225 is separated from underlying copper 209 by regions of the diffusion barrier 227 having minimal thickness. Preferable barrier thicknesses can range between about 5 and 100 Angstroms, depending upon device requirements. Substrate 200 is now ready for bulk electrofill (or electroless metal deposition) for formation of conductive routes that will completely fill its surface features. Once the metal conductive layers are deposited, the process flow of FIG. 1A is done.

Note that diffusion barrier stack structures (bilayers, trilayers, etc.) as described in the invention, can provide better protection against metal diffusion than single layers due to the combined properties of the individual layers of which they are made. In some cases, multi-layered diffusion barriers can also be made thicker to serve as a fill element. For example, in some low-k dielectric applications, lithography leaves the dielectric with undercuts (notches) or bowing (concavity) in the sidewalls. These defects can be repaired by deposition of extra barrier material that fills the defects. Judicious combinations of CVD, ALD and PVD methods are used to achieve this end.

In many cases, single Damascene processing is employed only at local interconnect (M1). The M1 trench has an aspect ratio of typically ~2:1. In other cases, single Damascene processing is used at intermediate interconnect levels. The previously described Barrier First process flow (see e.g., U.S. patent application Ser. No. 10/412,562 previously incorporated by reference) does apply to the via single Damascene step. However, this process flow is not necessarily applicable to the trench single damascene step. There, the process of this invention may be preferred.

IMPLEMENTATION EXAMPLE

As mentioned, methods of the invention employ a simultaneous etch/deposition to etch barrier material at the trench bottom while depositing barrier material elsewhere on a wafer substrate. As well, various aspects of process flows involve deposition of barrier materials (by ALD, CVD, PDL or PVD), precleaning, and degassing operations. In preferred embodiments all these process steps are done in the same processing tool. Tools that allow degas, preclean, ALD, PDL, or CVD deposition, and PVD deposition all under the same vacuum are the INOVA and INOVA xT deposition systems available from Novellus Systems of San Jose, Calif. These systems are comprised of processing modules, e.g., for Degas, Cool, Preclean, PVD, CVD, PDL or ALD processes, mounted to the same wafer handling system. Therefore, once a wafer is in the tool and a vacuum is established, all of the above described process aspects are performed without breaking vacuum. For example, a wafer is placed into the system, it is degassed, cooled, and optionally precleaned (for example with an argon plasma). Then, a first tantalum simultaneous etch/deposition process is carried out which deposits the first portion of the diffusion barrier and etches at least the bottom of the recessed features. Next, a second deposited layer of barrier material is formed using PVD (e.g. tantalum nitride), forming the final diffusion barrier structure. At this point, the structure can be covered with a metal seed layer or other metal structure.

Preferably the simultaneous etch/deposition steps are carried out using a hollow cathode magnetron (HCM) sputtering module. Such devices are described in U.S. Pat. No. 5,482,611, naming Helmer et al. as inventors, U.S. Pat. Nos. 6,179,973 B1 and 6,193,854 B1, naming Lai et al. as inventors, and U.S. Pat. No. 6,217,716 B1 naming Lai as the inventor. Each of these patents is incorporated herein by reference for all purposes. If the barrier material to be deposited is tantalum or tantalum nitride, a tantalum target source is used.

In some embodiments, a suitable apparatus employs a magnetic array for generating a confined plasma of high ion density. The magnetic array may be implemented as one or more electromagnets, permanent magnets, or some combination of electromagnets and permanent magnets. The apparatus may include other magnets located proximate the substrate region for promoting process uniformity.

Figure 3:
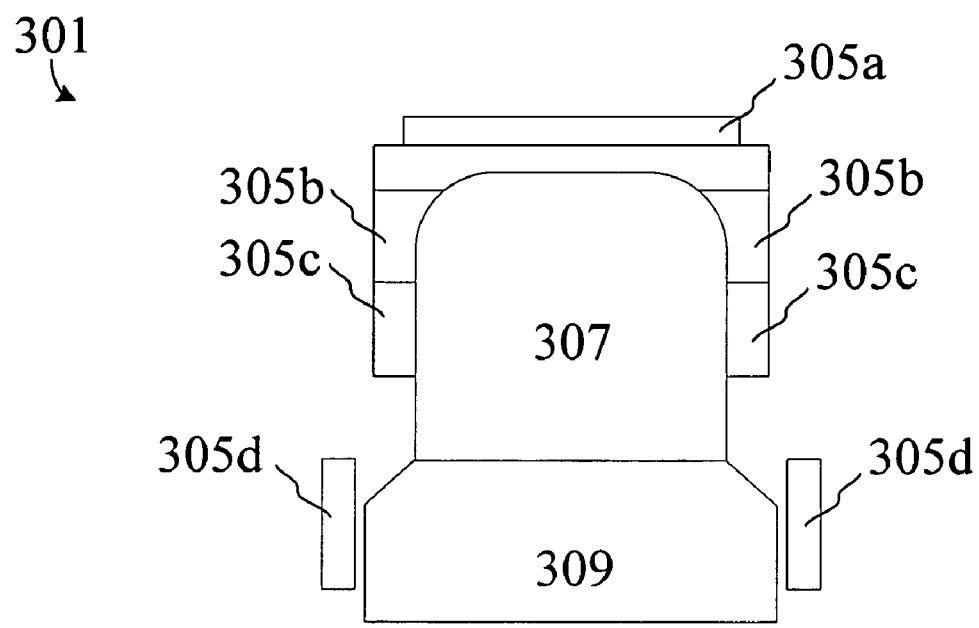
FIG. 3 is a cross-sectional depiction of the hollow cathode magnetron (HCM) apparatus suitable for practicing the current invention.
Figure 3:
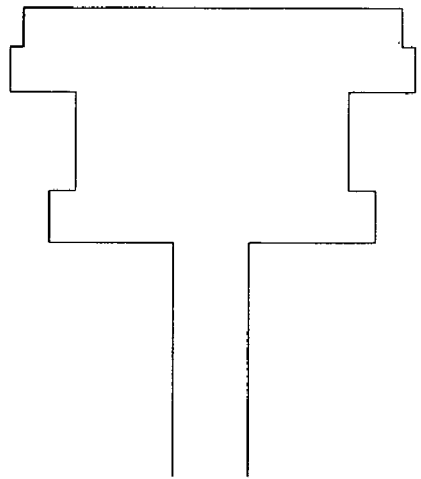

FIG. 3 presents a simple cross sectional view of one type of HCM sputtering apparatus that can be used in accordance with the invention. The HCM apparatus has two main components, the source 301, in which a plasma is created and maintained, and the RF bias electrostatic chuck (ESC) pedestal 303, which secures the wafer and applies an RF bias on the wafer, if needed. In this specific example, the source 301 contains four electromagnets 305a–305d, a cathode target 307 and an anode 309. The cathode target 307 generally has a hollow cup-like shape so that plasma formed in the source can be concentrated within this hollow region. The cathode target 307 also serves as a sputter target and is, therefore, made of a metal material such as tantalum, which is to be deposited onto a substrate.

An inert gas, such as argon, is introduced to into the hollow region of the cathode target 307 to form a plasma. An intense magnetic field is produced by electromagnets 305a–305d within the cathode target region. Additional electromagnets are arranged downstream of the cathode target so that different currents can be applied to each electromagnet, thereby producing an ion flux and a controlled deposition and/or etch rate and uniformity. An anode 309, typically held at plasma floating potential, is used, in conjunction with the source electromagnets to shape the plasma distribution at the target mouth. The RF bias ESC pedestal 303 holds the wafer substrate in place and can apply a RF bias to the wafer substrate. The ion energy, and therefore the etch rate can also be controlled by the pedestal RF bias. An additional function of the ESC pedestal is to provide wafer temperature control during deposition and resputtering. Typically, argon backside gas is used to provide thermal coupling between the substrate and the ESC. In many cases, the ESC is cooled during deposition.

Generally, a plasma reactor that allows fine control of the plasma conditions can be tuned to provide the E/D variations over substrate topology as desired for certain embodiments of this invention. The INOVA HCM reactors provided by Novellus Systems have eight or more separate electromagnetic coils. Each of these, and particularly those located near the substrate, can be independently controlled to fine tune the E/D profile from the via bottom to the field region and from the center to the edge across the wafer.

Preferred resputter process conditions include a pressure of between about 0.1 and 100 mTorr. Argon process flows are between about 10 and 300 SCCM (standard cubic centimeters per minute). When E/D>1 is desired both at the bottom of the recessed features and in the field, a DC source power of between about 1 and 10 kW is applied to the tantalum target. The electromagnet coil currents used are between about 0–10 A. The current polarity and current levels are optimized to obtain uniform deposition and resputter across the wafer surface, as well as to maximize utilization of the target.

The wafer temperature is manipulated using a temperature controlled stage, the wafer temperatures used are between about −100 and 100° C., preferably about −20° C. The wafer is biased with an RF frequency source located below or in proximity to the stage. The RF power applied is preferably between about 100 and 2000W. In preferred embodiments, the amount of sputtering is controlled by the RF power at fixed RF frequency. Various RF frequencies can be used to achieve this effect. One preferred RF frequency is 13.56 MHz.

In general, etch rate is most strongly related to the RF power, while the deposition rate is most strongly related to the DC source power. The E/D ratio depends predominantly on the ratio of RF power (table) to DC power (source). Higher RF/DC power ratios correspond to higher the E/D ratios on the wafer. The etch rate is largely dependent on RF power and pressure since these parameters control the energy of argon ions near the wafer. The deposition rate is largely dependent on DC power since this parameter affects the flux and energy of argon ions near the surface target.

Controlling the plasma potential and the bias on the wafer can provide the etch conditions required for this invention. The energy of the argon ions, and therefore the etch rate, is proportional to the difference between plasma potential and wafer potential. The deposition rate during re-sputtering is proportional to the DC power applied to the HCM target. However, the deposition rate in the trench (or via) is reduced due to the off-normal component of the material (tantalum) flux. The etch rate at the trench and via bottom is almost independent on the feature geometry due to the high directionality of argon ion flux. These effects lead to the following E/D relationships during the resputter step: E/D (trench bottom)>E/D (field)>E/D (sidewall). On the sidewall, E~0, resulting in net deposition. Thus, the etch/deposition ratio (E/D) can be controlled so that it is significantly greater than 1 in the trench bottom while only slightly greater than 1 on field horizontal surfaces. The magnitude of E/D on the side walls is approximately 0 because the plasma flux is directed primarily toward the wafer surface (parallel with the side walls). Thus, only horizontal surfaces (with relatively large surface areas (compared to the side walls)) are effectively etched by the impinging plasma flux. The sidewalls receive a net deposition.

If tantalum nitride or nitrogen-doped tantalum is the barrier material to be deposited, a nitrogen source such as $N_2$ will be used at 5–100 SCCM, preferably about 10–50 SCCM in conjunction with argon. Titanium silicon nitride is deposited by CVD using a technique described in U.S. Pat. No. 6,541,374, entitled "Method of Depositing a Diffusion Barrier for Copper Interconnection Applications" issued to de Felipe et al. on Apr. 1, 2003, or U.S. Pat. No. 6,566,246, titled "Improved Deposition of Conformal Copper Seed Layers by Control of Barrier Layer Morphology" issued to de Felipe et al. on May 20, 2003, both of which are incorporated herein by reference for all purposes.

As mentioned previously, in preferred embodiments of the invention, some of the processes of this invention are performed without using a preclean step prior to deposition the first portion of the diffusion barrier. It should be understood that the elimination of the separate preclean is contrary to previous typical methods. As discussed previously, traditionally, the preclean typically involves an argon sputter etch or reactive sputter to remove contaminants such as metals, metal oxides and residues from etch and photoresist processes. However, experimental evidence in accordance with the present invention show that process steps described in the present invention can sufficiently clean the substrate surface and that a separate preclean step is not necessary, and may even be detrimental.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for depositing a diffusion barrier and a metal conductive layer for metal interconnects on a substrate, the method comprising:
   (a) etching the bottoms of recessed features on a surface of the substrate to clean at least part of an underlying metal while simultaneously depositing a first portion of a diffusion barrier on at least sidewalls of recessed features wherein depositing a first portion of a diffusion barrier comprises sputtering metal from a target;
   (b) after depositing the first portion of the diffusion barrier, depositing a second portion of the diffusion barrier, which covers at least the bottoms of the recessed features; and
   (c) depositing the metal conductive layer over the surface of the substrate.

2. The method of claim 1, wherein the method does not employ a precleaning operation prior to (a).

3. The method of claim 1, further comprising, after (b) and prior to (c), etching the second portion of the diffusion barrier at least at the bottoms of the recessed features without exposing an underlying metal.

4. The method of claim 1, further comprising performing a degas operation prior to (a).

5. The method of claim 1, wherein at least some of the recessed features have aspect ratios of not greater than about 2.

6. The method of claim 1, wherein the recessed features are trenches of a single Damascene structure.

7. The method of claim 1, wherein at least operations (a) and (b) are performed in the same processing chamber.

8. The method of claim 7, wherein the processing chamber is a plasma physical vapor deposition (PVD) chamber.

9. The method of claim 7, wherein the processing chamber comprises a hollow cathode magnetron.

10. The method of claim 4, wherein the substrate is degassed by heating the substrate to between about 150 to 400 degrees Celsius.

11. The method of claim 1, wherein (a) comprised etching the bottoms of recessed features to a depth of about 20 to 100 Angstroms into the underlying metal.

12. The method of claim 1, wherein (a) comprises etching under conditions producing an etch-to-deposition ratio ranging between about 1 and 1.5 in field regions of the substrate and an etch-to-deposition ratio ranging between about 1.1 and 3 in the bottoms of the recessed features.

13. The method of claim 1, wherein (a) comprises depositing the first portion of diffusion barrier elsewhere on the substrate to a thickness of between about 10 and 100 Angstroms on field regions of the substrate and sidewalls of the recessed features.

14. The method of claim 1, wherein (b) comprises depositing the second portion of diffusion barrier to a thickness of at least about 5 Angstroms on the bottoms of the recessed features.

15. The method of claim 1, wherein (a) comprises sputtering a meal from a target having an applied DC power of between about 1 and 10 kW and biasing the substrate with about 200 to 2000 W of RF power.

16. The method of claim 1, wherein (b) comprises using chemical vapor deposition (CVD), physical vapor deposition (PVD), atomic layer deposition (ALD), or pulsed deposition layer (PDL).

17. The method of claim 1, wherein at least one portion of the diffusion barrier comprises a material selected from the group consisting of tantalum, nitrogen-doped tantalum, tantalum nitride, titanium nitride, tungsten nitride, ruthenium, and silicon containing versions of any of these.

18. The method of claim 1, wherein (a) comprises sputtering a metal from a target having an applied DC power of between about 1 and 30 kW, while applying a bias to the substrate.

19. The method of claim 18, wherein the bias comprises RF power of between about 100 and 2000 W.

20. The method of claim 18, wherein (a) further comprises passing argon gas through the process chamber at a flow rate of between about 10 and 300 sccm.

21. The method of claim 1, wherein the metal conductive layer of (c) comprises copper.

22. The method of claim 21, wherein the metal conductive layer is a copper seed layer.

23. A method of claim 1, further comprising, prior to (a), depositing a portion of the diffusion barrier on the surface of the partially fabricated integrated circuit such that the sidewalls of the recessed features have a diffusion barrier thickness of between about 5 and 100 Angstroms.

* * * * *

UNITED STATES PATENT AND TRADEMARK OFFICE
CERTIFICATE OF CORRECTION

| | |
|---|---|
| PATENT NO. | : 7,186,648 B1 |
| APPLICATION NO. | : 10/804353 |
| DATED | : March 6, 2007 |
| INVENTOR(S) | : Rozbicki et al. |

It is certified that error appears in the above-identified patent and that said Letters Patent is hereby corrected as shown below:

In the Title Page (63):

In the section titled "Related U.S. Application Data" change "application No. 09/965,475" --application No. 09/965,472--.

In the Specification:

Column 1, line 13, change "Ser. No. 09/965,475" to --09/965,472--.

In the Claims:

In line 2 of claim 15 (column 14, line 24) change "meal" to --metal--.

Signed and Sealed this

Twentieth Day of November, 2007

JON W. DUDAS
*Director of the United States Patent and Trademark Office*